(12) United States Patent
Morin et al.

(10) Patent No.: US 6,231,370 B1
(45) Date of Patent: May 15, 2001

(54) ELECTRICAL CONNECTOR FOR LEADED ELECTRONIC COMPONENT

(75) Inventors: Scott Frederick Morin, Fort Lauderdale, FL (US); Michael Paul Derstine, Winston-Salem, NC (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/229,260

(22) Filed: Jan. 13, 1999

Related U.S. Application Data

(60) Provisional application No. 60/087,859, filed on Jun. 3, 1998, and provisional application No. 60/078,650, filed on Mar. 19, 1998.

(51) Int. Cl.[7] .................................................. H01R 13/62
(52) U.S. Cl. ......................... 439/366; 361/807; 439/698
(58) Field of Search .................................. 439/366, 698, 439/330, 58, 683, 682, 500, 70; 361/807–809, 782, 783

(56) References Cited

U.S. PATENT DOCUMENTS

| | | | |
|---|---|---|---|
| 3,017,598 | * 1/1962 | Low | 439/366 |
| 4,161,762 | 7/1979 | Scheithauer | 361/124 |
| 4,417,777 | * 11/1983 | Bamford | 439/70 |
| 4,466,050 | 8/1984 | Lockard | 362/307 |
| 4,470,650 | * 9/1984 | Lundergan | 439/70 |
| 4,471,414 | * 9/1984 | Savage, Jr. | 362/226 |
| 4,582,385 | 4/1986 | Couper et al. | 339/147 R |
| 4,613,732 | 9/1986 | Cwirzen et al. | 179/178 |
| 4,616,895 | * 10/1986 | Yoshizaki et al. | 439/330 |
| 4,660,907 | 4/1987 | Belter | 339/14 R |
| 4,667,270 | * 5/1987 | Yagi | 361/820 |
| 4,772,221 | 9/1988 | Kozlof | 439/549 |
| 5,030,122 | 7/1991 | Birch et al. | 439/188 |
| 5,117,330 | 5/1992 | Miazga | 361/400 |
| 5,127,837 | * 7/1992 | Shah et al. | 439/71 |
| 5,141,455 | 8/1992 | Ponn | 439/620 |
| 5,154,639 | 10/1992 | Knoll et al. | 439/620 |
| 5,213,522 | 5/1993 | Kojima | 439/620 |
| 5,221,209 | * 6/1993 | D'Amico | 439/71 |
| 5,317,474 | 5/1994 | Capper et al. | 361/119 |
| 5,387,116 | 2/1995 | Wang | 439/188 |
| 5,397,252 | 3/1995 | Wang | 439/620 |
| 5,403,195 | 4/1995 | Thrush et al. | 439/69 |
| 5,439,384 | 8/1995 | Thrush et al. | 439/69 |
| 5,695,367 | 12/1997 | Takano et al. | 439/699.2 |
| 5,761,804 | 6/1998 | Adachi | 29/855 |

FOREIGN PATENT DOCUMENTS

| 0438238 | 7/1991 | (EP) . |
|---|---|---|
| 0564117 | 10/1999 | (EP) . |

OTHER PUBLICATIONS

Abstract of the Invention, Docket No. 16768, Serial No. 08/768,875, Filed Dec. 17, 1996.

* cited by examiner

*Primary Examiner*—Brian Sircus
*Assistant Examiner*—Hae Moon Hyeon

(57) ABSTRACT

An electrical connector (10) for mounting a leaded electronic component (70) to a circuit board (80) includes a housing (12) having a base (18) with side walls (44) and at least one end wall (30) extending upwardly therefrom together defining a component-receiving cavity (50) extending to an entrance along an insertion face 14. The housing (12) further includes at least first and second terminals (54) disposed in respective terminal-receiving passageways (32). Each terminal (54) has a lead-terminating section (56) exposed to the insertion face (14) for terminating to a respective component lead (80) during component insertion. Side walls (44) include inwardly directed retention latches (46) parallel to and spaced above base (18) and dimensioned to engage and extend over a respective portion of an upper surface of said electronic component to secure said component in said cavity upon full component insertion.

13 Claims, 6 Drawing Sheets

ELECTRICAL CONNECTOR FOR LEADED ELECTRONIC COMPONENT

This application claims the benefit of U.S. Provisional Application(s) No(s). 60/087,859, filed Jun. 3, 1998, and filed Mar. 19, 1998.

FIELD OF THE INVENTION

This invention is related to electrical connectors and more particularly to electrical connectors for mounting a leaded electronic component to a circuit bearing article.

BACKGROUND OF THE INVENTION

The use of leaded electronic components in electrical devices is well known. The components may include surface mountable leads, or through-hole leads, which can be mounted to a circuit bearing article by various methods as known in the art. For purposes of illustrating the invention, the connector will be described with reference to a pager and quartz crystal used with the pager. It is to be understood that the invention is suitable for use with other electronic devices and components as well, such as personal communication system devices, or the like. In pagers and similar electronic devices, it is necessary to key or encode a circuit board and a specified component with a unique telephone or pager number.

Typically a pager will include a leaded quartz crystal having a specific code. In the prior art, this quartz crystal was hand soldered to a circuit board. The circuit board was then marked with the unique coding for use in a pager by a customer. If the customer wanted to change the pager number, it was necessary to return the circuit board with the crystal soldered thereto to the manufacturer to provide a new board with another crystal. It is desirable, therefore, to provide a system whereby a crystal could be readily mounted to the circuit board of the pager and the resulting telephone number or code be changed without having to return the circuit board to the manufacturer for reworking or replacement.

Furthermore, hand soldering of the leads of the crystal is a time consuming process. It is also desirable therefore, to have a system for securing the leaded component to the circuit bearing article without the need for hand soldering, thereby facilitating assembly of the pagers.

SUMMARY OF THE INVENTION

The present invention is directed to connecting an electronic component to a circuit bearing article, such as a circuit board, that eliminates problems associated with the prior art. An electrical connector for mounting a leaded component to a board includes a housing having a base with at least one end wall and opposed side walls extending upwardly therefrom, altogether defining a component-receiving cavity. The housing further includes at least first and second terminal-receiving passageways having first and second terminals desposed therein. The component-receiving cavity extends to an entrance along an insertion face. Each of the first and second terminals include a lead-terminating section and connecting section for electrical connection to a circuit terminus of a circuit bearing article. Each lead-terminating section is exposed to the insertion face for terminating to a respective component lead during component insertion. Each of the two opposed side walls include an inwardly directed retention portion substantially parallel to and spaced above the base and dimensioned to engage and extend over a respective portion of an upper surface of an electronic component to secure the component in the cavity upon full insertion thereof.

In one embodiment the housing includes a second end wall and a further retention or latching portion. The side walls may be formed of dielectric material or may be metal.

The advantages of the present invention include that the electronic components for a pager, or the like, can be readily changed, without having to "unsolder" the leads as in the prior art. Thus, in the case of a pager, the pager retailer can change "calling numbers" for the pager without having to return the entire assembly to the pager manufacturer. Additionally in manufacturing the pager, the electrical connector can be secured to the circuit board at the same time other permanently mounted components are mounted thereto, by means known in the art. The structure of the electrical connector as well as the electronic component permits pick-and-place equipment to be used to facilitate manufacturing. Furthermore, the capability of loading the component from the top of the connector housing, rather than inserting the component into an end of the housing allows other electrical devices to be mounted close to the connector on the circuit board, thereby helping to minimize the size of the circuit board used within the pager.

In one example of the connector, the housing defines a top mountable cavity in which the leaded component includes right angle leads. In another example, the electronic component includes straight leads. It is to be understood that the housing may be orientated in either a horizontal or vertical direction relative to the circuit board. It is to be further understood that the electronic component may have two or more leads and that the housing will include a corresponding number of terminals, one for each lead.

Embodiments of the invention will now be described by way of example with reference to the accompanying drawings.

DETAILED DESCRIPTION OF EMBODIMENTS OF THE INVENTION

Figure 1:
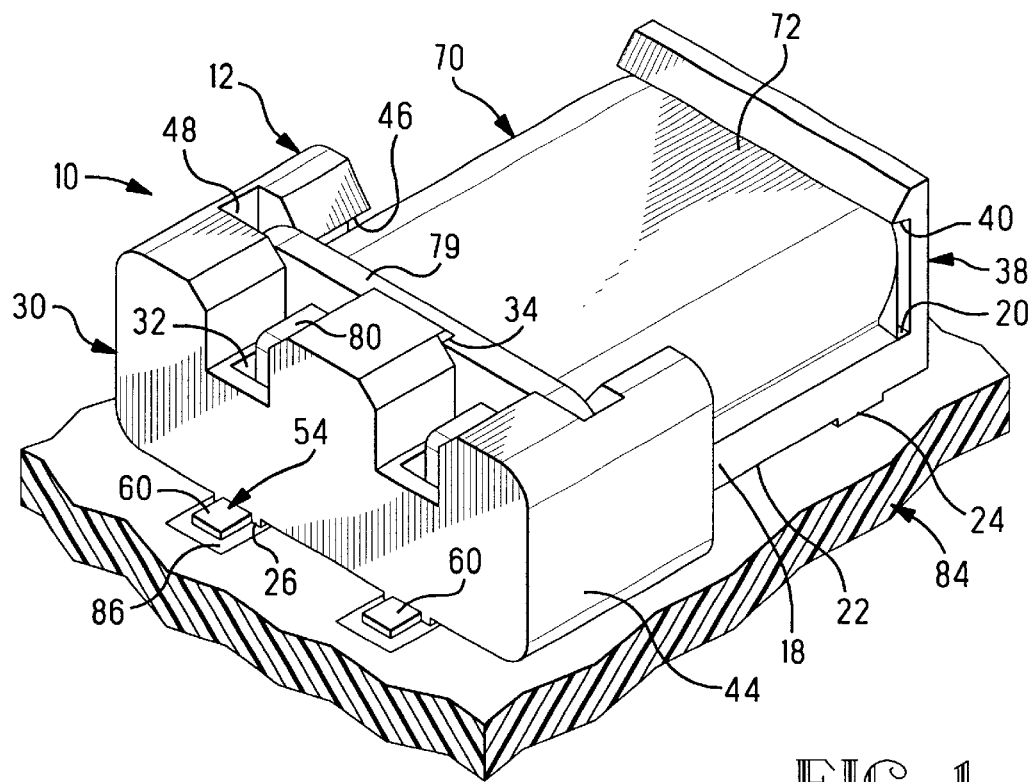
FIG. 1 is an isometric view of an assembly including a connector made in accordance with the invention and having an electronic component mounted therein.
Figure 3:
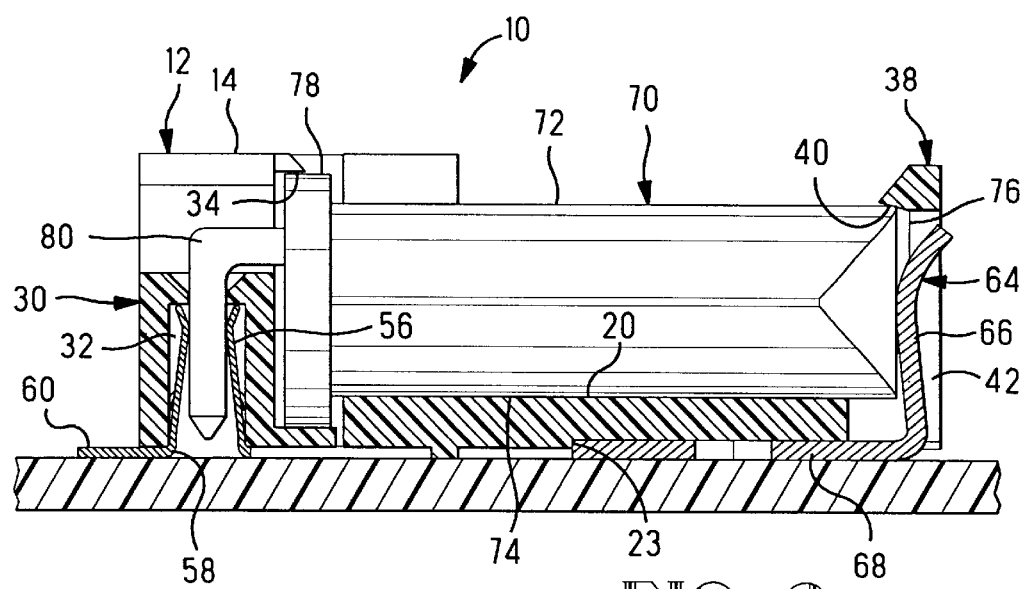
FIG. 3 is a cross-sectional view of the assembly of FIG. 1.
Figure 2:
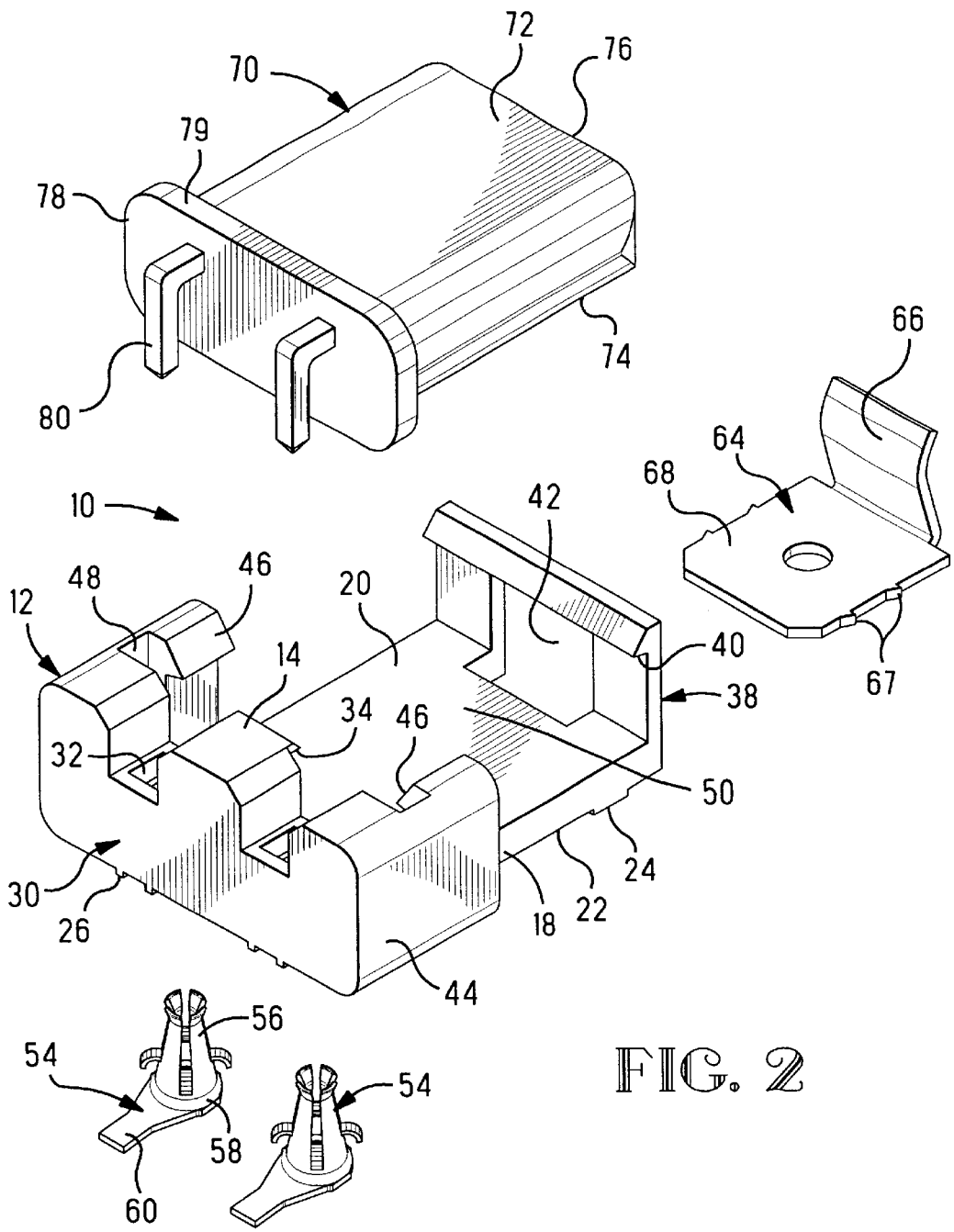
FIG. 2 is an exploded view of the assembly of FIG. 1.

Referring now to FIGS. 1, 2 and 3, connector 10 includes a housing 12 having first and second terminals 54 mounted in respective terminal-receiving passageways 32 therein. Housing 12 includes a component insertion face 14 and an opposed base 18, opposed first and second end walls of 30, 38 and opposed side walls 44 all thereby defining a component-receiving cavity 50. Base 18 includes a component receiving face 20 and a board mounting face 22 having stand-offs 24 and terminal guides 26 extending downwardly therefrom.

End wall 30 includes terminal-receiving passageways 32 extending therethrough for receiving the corresponding terminals 54 therein. Each of the first and second terminals 54 includes a body 58 having a lead-terminating section 56 at one end that is exposed to the insertion face 14 for terminating to a respective component lead 80 and a connecting section 60 at the other end for securing to a conductive member, for example a circuit pad, 86 on a circuit bearing article, for example a circuit board, 84, as shown in FIG. 1. Terminal guides 26 are adapted to hold the connecting sections 60 of terminals 54 to assure that the board connecting sections 60 are aligned with the corresponding circuit pads 86 on circuit board 84.

First and second end walls 30, 38 and side walls 44 include retention portions such as latches 34, 40 and 46, respectively that extend over the component-receiving cavity 50 and are adapted to secure the component in the cavity upon full component insertion. Second end wall 38 includes an aperture 42 extending therethrough dimensioned to receive an optional biasing member 64 therein. Biasing member 64 includes a board mounting foot 68 and a spring member 66 adapted to provide a biasing force against end wall 76 of the component 70 upon full insertion into the connector 10. Biasing member 64 is formed of metal and can also be used to provide a ground connection for component 70, if required. Member 64 is secured in base 18 by means of barbs 67 that extend into walls of recess 23.

Component 70 includes opposed substantially flat upper and lower surfaces 72, 74, a first end wall 76, and a second end wall 78 having a flange 79 and a pair of leads 80 extending therefrom. In the embodiment shown, end wall 78 defines a flange and the leads 80 are bent at a right angle for insertion into the terminals 54 of connector 10. It is to be understood that the configuration of the component may be varied to provide straight leads as well as right angle leads and the corresponding terminals and connector housing may be modified accordingly. It is also to be recognized that the component may have more than two leads and that the housing may be modified accordingly to provide a corresponding number of terminals for receiving the leads.

In the embodiment shown, the housing side walls 44 further include flange-receiving slots 48 dimensioned to receive flange 79 upon inserting component 70 into the component receiving cavity 50. When inserting the component 70 into housing 10, the side walls 44 and the end wall 38 deflect sufficiently outwardly to allow the component 70 to be mounted in place and then returned to their original position to securely hold component 70 in housing. Upon full insertion of component 70 into cavity 50, the leads 80 are received in the lead-terminating sections 56 of terminals 54, the flange 79 into slots 48 and the lower surface 74 of component 70 engages the component receiving face 20 of base 18. When the component 70 is fully inserted into the housing cavity 50 the retention latches 34, 40 and 46 extend over the upper surface 72, as shown in FIG. 1 to secure the component 70 within the connector housing 12.

Figure 4:
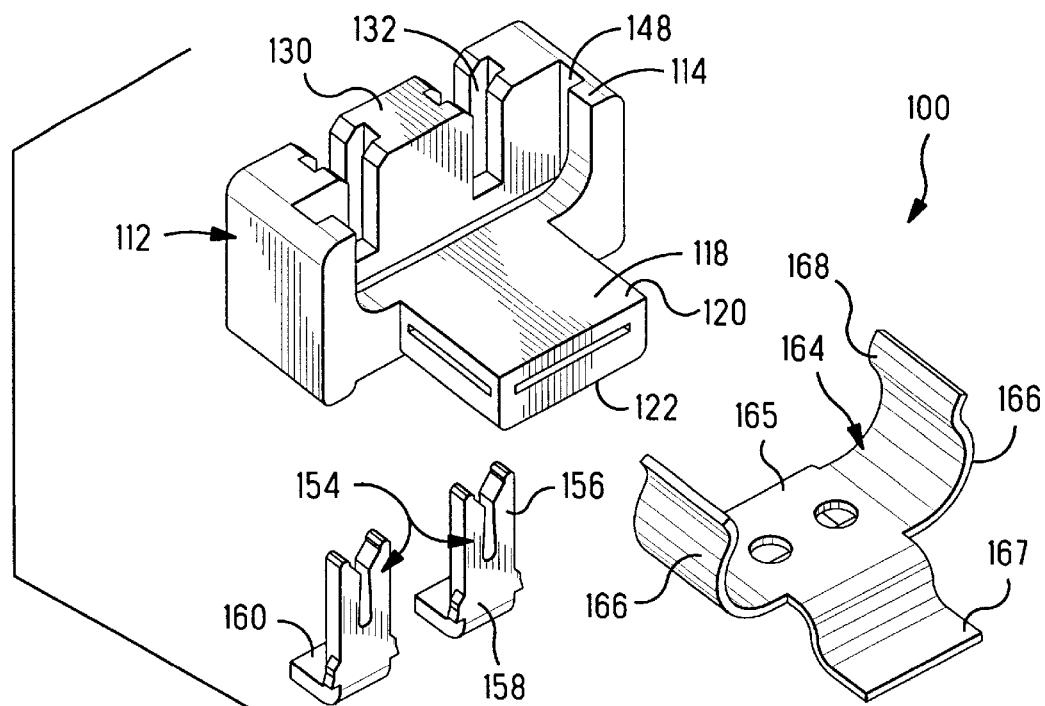
FIG. 4 is an exploded view of an alternative embodiment of a connector made in accordance with the invention.
Figure 5:
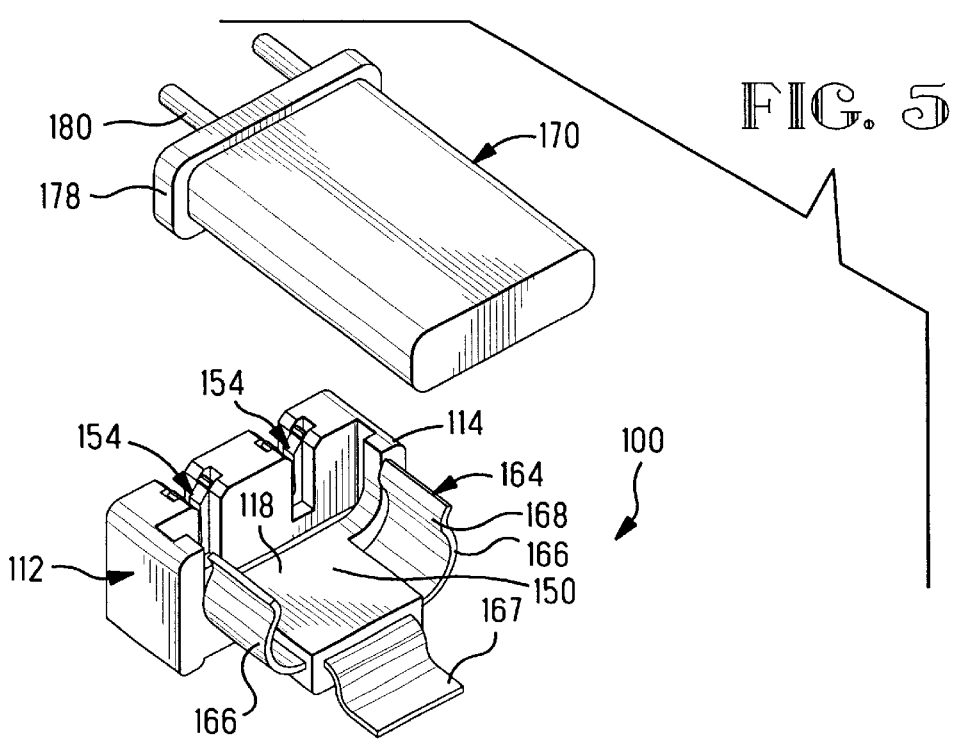
FIG. 5 is an assembled view of the connector of FIG. 4 having an electronic component exploded therefrom.
Figure 7:
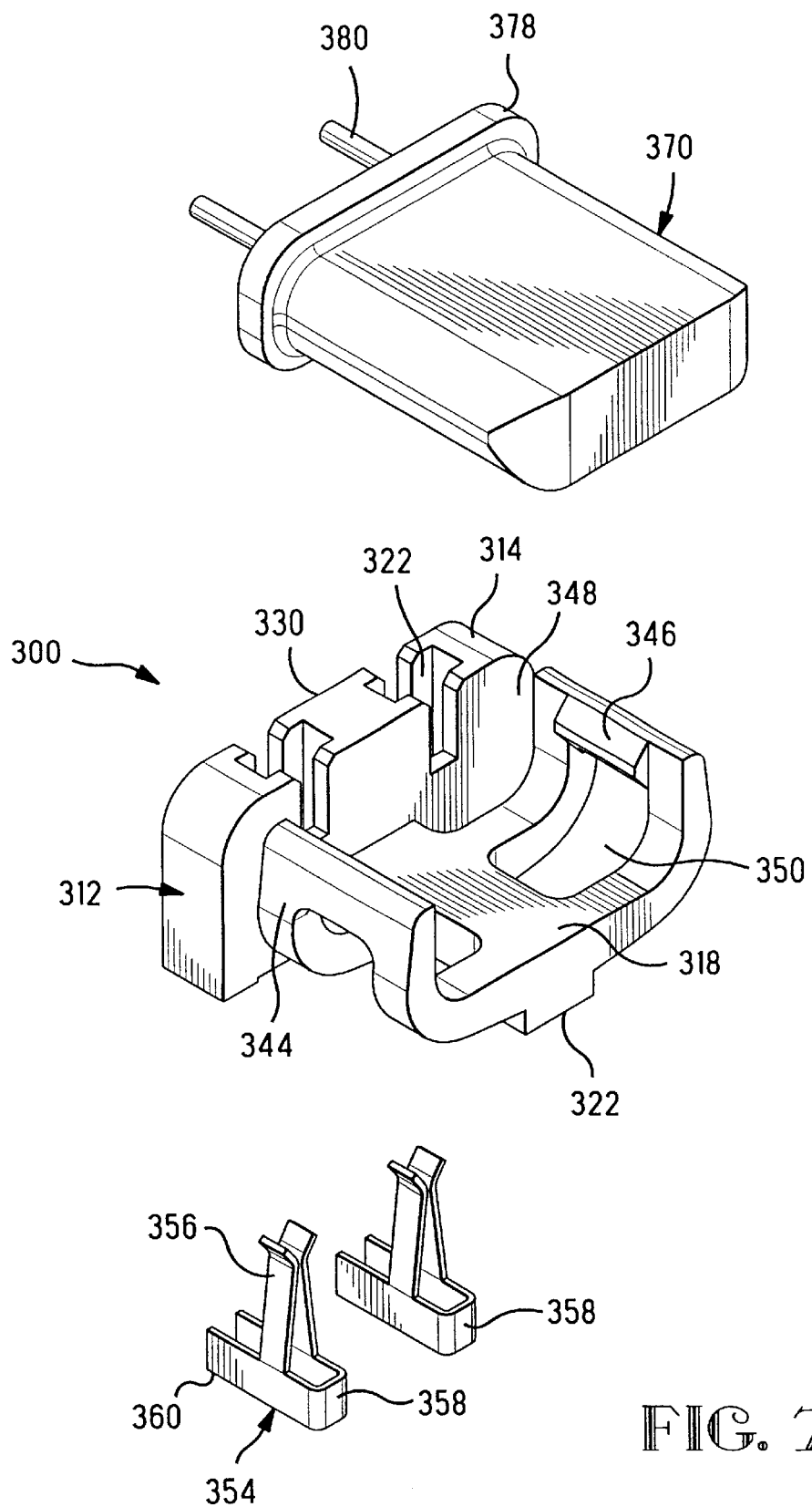
FIG. 7 is an exploded view of another alternative embodiment of a connector made in accordance with the invention.
Figure 8:
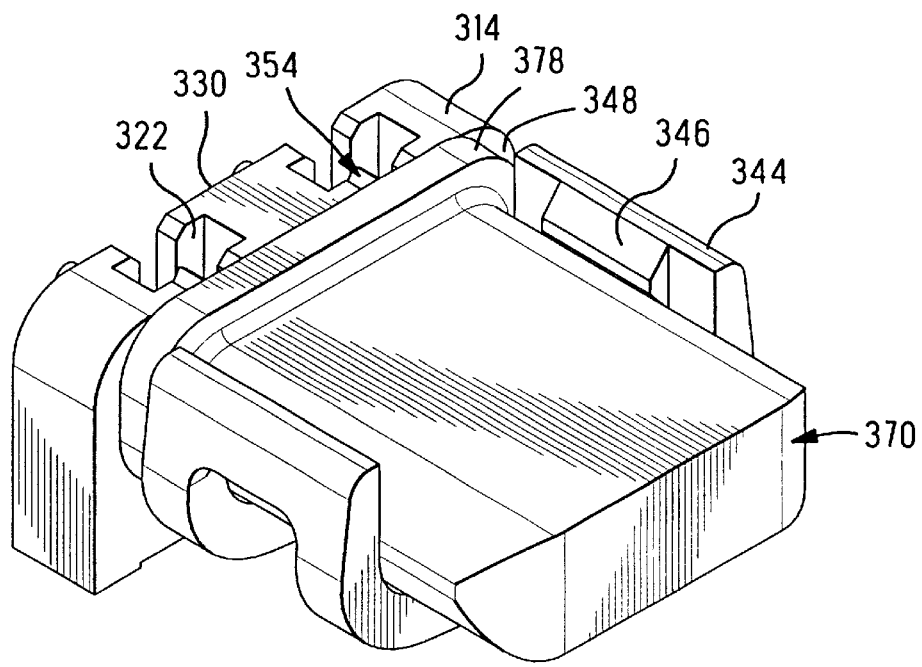
FIG. 8 is an assembled view of the connector of FIG. 7 as viewed from the component end of the connector.
Figure 9:
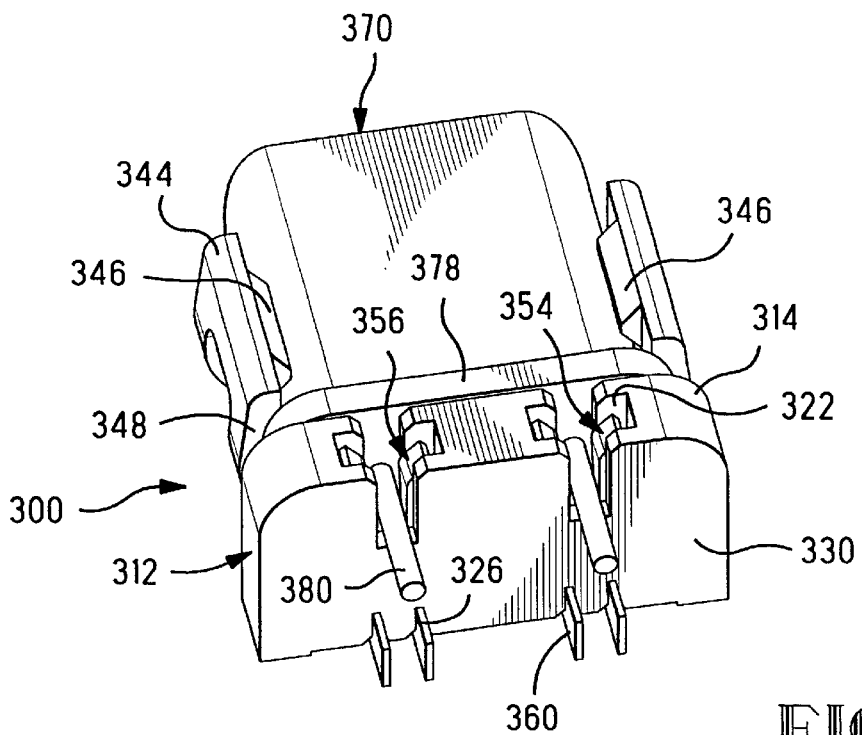
FIG. 9 is an assembled view of the connector of FIG. 7 as viewed from the end wall of the connector.

Referring now to FIGS. 4 and 5, connector embodiment 100 includes a housing 112 having first and second terminals 154 mounted in respective terminal-receiving passageways 132 therein and retention clip 164. Housing 112 includes a component insertion face 114 and an opposed base 118 and end wall 130. Base 18 includes a component receiving face 120 and a board mounting face 122. Retention clip 164 is secured to base 118 and has a body 165 and opposed side walls or arms 166 that extend upwardly from the base defining side walls for embodiment 100. The end wall 130, base 118 and side walls 166 define a component-receiving cavity 150. Walls 166 include inwardly directed retention portions 168. In the embodiment shown, clip 164 further includes a board mounting section 167. As shown in FIGS. 4 and 5, clip 164 is a metal piece that is overmolded by dielectric material when housing 112 is molded. It is to be understood that the side arms or walls may also be molded of dielectric material, such as shown in FIGS. 7 through 9 and the board mounting section may be a separate metal member or eliminated.

End wall 130 includes terminal-receiving passageways 132 extending therethrough for receiving the corresponding terminals 154 therein. Housing 112 further includes flange-receiving slots 148 dimensioned to receive flange 178 of component 170 into the component receiving cavity 150 in the same manner as previously discussed.

In this embodiment, each of the first and second terminals 154 includes a body 158 having a lead-terminating section 156 at one end that is exposed to the insertion face 114 for terminating to a respective component lead 180 and a connecting section 160 at the other end for securing to a conductive member on a circuit bearing article as previously discussed. Each lead-terminating section 156, as shown herein, is a pair of upstanding compliant arms defining a lead-receiving slot that is dimensioned to receive leads of the component 170 therein.

Component 170 is substantially the same as component 70 except that the leads 180 are straight, rather than being bent at a right angle. When inserting the component 170 into housing 112, the side walls 166 of clip 164 deflect sufficiently outwardly to allow the component to be mounted in place and then returned to their original position to securely hold component 170 in the housing. Upon full insertion of component 170 into cavity 150, the leads 180 are received in the lead-terminating sections 156 of terminals 154, the flange 178 into slots 148.

Figure 6:
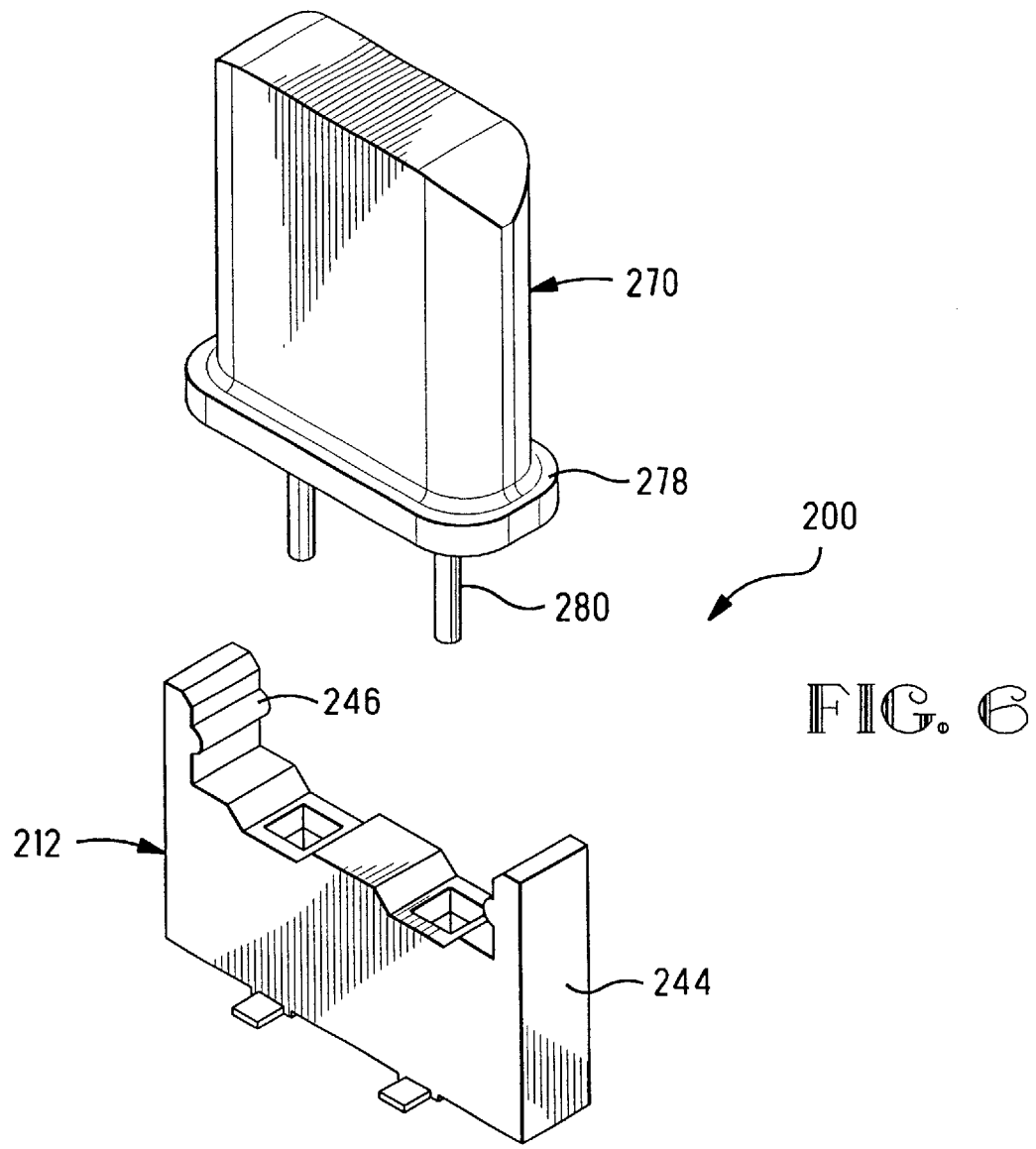
FIG. 6 is an isometric view of a further embodiment of the invention with a vertically oriented component exploded therefrom.

Connector embodiment 200, shown in FIG. 6, is adapted to receive component 270 in a vertical orientation. Housing 212 includes terminals (not shown) adapted to receive leads 280. Side walls 244 include retention portion or latches 246 adapted to receive portions of flange 278 and retain component 270 securely in housing 212.

FIGS. 7 through 9 illustrate another embodiment 300 of the connector that includes a housing 312 having first and second terminals 354 mounted in respective terminal-receiving passageways 322 therein. Housing 312 includes a component insertion face 314 and an opposed base 318, end wall 330, and opposed side walls 344 all thereby defining a component-receiving cavity 350. Flange-receiving slots 348 are formed between end wall 330 and side walls 344 for receiving flange 378, as best seen in FIGS. 8 and 9. Base 318 includes terminal-receiving slots 326 extending inwardly from the board mounting face 322, as best seen in FIG. 9. Side walls 344 include retention portions or latches 346 that extend over the component-receiving cavity 350 and are adapted to secure the component 370 in the cavity upon full component insertion.

End wall 330 includes terminal-receiving passageways 322 extending therethrough for receiving the corresponding terminals 354 therein. Each of the first and second terminals 354 includes a U-shaped body 358 having a pair of upstanding spring arms defining a lead-terminating section 356 that is exposed to the insertion face 314 for terminating to a respective component lead 380 and a connecting section 360 along the bottom edges for securing to a conductive member on a circuit bearing article, not shown. Terminal-receiving slots 326 are adapted to hold the U-shaped bodies of terminals 354 to assure that the board connecting sections 360 are aligned with the corresponding circuit pads on the circuit bearing article. It is to be understood that leads 380 may be straight or bent at a right angle.

The connectors 10, 100, 200 and 300 of the present invention provide systems that allow an electronic component to be readily mounted to a circuit bearing article such as a circuit board and easily changed when necessary such as when changing a telephone number of a pager. The connectors provide a cost effective method of manufacturing the pager, or the like in that the connectors can be secured to the circuit bearing article at the same time as other permanently mounted components are secured to the board. The flat surfaces of both the connector base and the flat surfaces of the component lend themselves to the use of pick-and-place equipment for automated assembly. Top loading of the component into the respective connectors enables other devices to be mounted close to the connector on a circuit board or the like thereby maximizing the use of space on the board. The connectors of the present invention eliminate the need to hand solder the leads of the component to the circuit board. In the embodiment of FIGS. 1 through 3, the use of a biasing member 64 assures that the component 70 is pushed and held against the opposite end wall to securely hold the component 70 in the connector. In the embodiment of FIGS. 4 and 5, the side walls 166 of clip 164 assure that the component is held securely in the housing. The side wall portions 344 of the embodiment of FIGS. 7 through 9, hold component 370 within cavity 350. This is particularly important in that the component needs to be secure should the pager be subject to excessive vibrations or accidentally dropped.

It is thought that the electrical connectors of the present invention and many of its attendant advantages will be understood from the foregoing description. It is apparent that various changes may be made in the form, construction, and arrangement of parts thereof without departing from the spirit or scope of the invention, or sacrificing all of its material advantages.

What is claimed is:

1. An electrical connector for leaded electronic components comprising:

a housing having a base and at least one end wall and opposed side walls extending upwardly from said base all thereby defining a component-receiving cavity extending to an entrance along an insertion face, said housing further including at least first and second terminal-receiving passageways for receiving respective terminals therein and at least one flange receiving slot dimensioned to receive a flange extending outwardly from said component; and at least first and second terminals, each disposed in one of said terminal-receiving passageways, each terminal including a lead-terminating section and a connecting section for electrical connection to a circuit terminus of a circuit bearing article;

each said lead-terminating section being exposed to said insertion face for terminating to a respective component lead during component insertion;

each of said side walls including inwardly directed retention portions parallel to and spaced above said base and dimensioned to engage and extend over a respective portion of an upper surface of said electronic component to secure said component in said cavity upon full component insertion.

2. The electrical connector of claim 1 wherein said insertion face is opposed to said base.

3. The electrical connector of claim 1 wherein said side walls are portions of a metal member secured to said housing base.

4. The electrical connector of claim 1 wherein said lead-terminating section of each said terminal is a pair of elongate spring arms.

5. The electrical connector of claim 1 wherein said housing further includes a second end wall opposed to said first end wall.

6. The electrical connector of claim 5 wherein said second end wall includes a retention portion parallel to and spaced above said base and dimensioned to engage and extend over a respective portion of an upper surface of said electronic component to secure said component in said cavity upon full component insertion.

7. The electrical connector of claim 5 wherein said second end wall includes a spring member adapted to engage one end of said component and bias another end of said component against said first end wall.

8. The electrical connector of claim 7 wherein said spring member further includes a terminating section adapted to be connected to a ground circuit for said connector.

9. An electrical connector for leaded electronic components, comprising:

a housing defined by a base, a pair of opposed end walls and a pair of opposed side walls extending from the base to an insertion face thereby forming a generally rectangular shape, the housing including a pair of terminal-receiving passageways extending from the insertion face to the base;

a pair of terminals, each of the terminals residing in one of the terminal-receiving passageways, each terminal including a lead-terminating section adjacent the insertion face and a connection section extending from the base;

a component retention section including a component receiving cavity defined by said base and retention portions for retaining an electronic component; and a slot between the terminal-receiving passageways and the cavity.

10. An electrical connector as recited in claim 9, wherein the cavity extends from one of the end walls.

11. An electrical connector as recited in claim 9, wherein the cavity extends from the insertion face.

12. An electrical connector as recited in claim 9, wherein the cavity further comprises a spring member spaced from the housing and positioned to bias the component against the housing and adapted to connect to a ground circuit.

13. An electrical connector as recited in claim 9, wherein the cavity is formed integrally with the housing.

* * * * *